United States Patent [19]
Hurd et al.

[11] Patent Number: 6,137,290
[45] Date of Patent: Oct. 24, 2000

[54] MAGNETIC RESONANCE SPECTROSCOPIC IMAGING HAVING REDUCED CHEMICAL SHIFT ERROR

[75] Inventors: Ralph E. Hurd, Milipitas; Napapon Sailasuta, Morgan Hill; James Tropp, Berkeley, all of Calif.; Patrick L. Le Roux, Palaiseau, France

[73] Assignee: General Electric Company, Milwaukee, Wis.

[21] Appl. No.: 09/026,037

[22] Filed: Feb. 19, 1998

[51] Int. Cl.[7] ........................ G01V 3/00
[52] U.S. Cl. .................... 324/307; 324/309
[58] Field of Search .................. 324/307, 309, 324/314, 306, 312, 300

[56] References Cited

U.S. PATENT DOCUMENTS

| | | | |
|---|---|---|---|
| 4,480,228 | 10/1984 | Bottomley | 324/309 |
| 4,531,094 | 7/1985 | Ordidge et al. | 324/309 |
| 4,698,592 | 10/1987 | Feinberg | 324/309 |
| 4,737,714 | 4/1988 | Hanawa | 324/309 |
| 5,124,650 | 6/1992 | Granot | 324/309 |
| 5,537,039 | 7/1996 | Le Roux et al. | 324/309 |

*Primary Examiner*—Louis Arana
*Attorney, Agent, or Firm*—Townsend and Townsend and Crew; Christian G. Cabou; Phyllis Y. Price

[57] ABSTRACT

Chemical shift error in proton magnetic resonance spectroscopy is reduced by applying a volume excitation pulse sequence such as PRESS and very selective out-of-volume saturation pulses to limit that volume to a volume-of-interest free of the misregistration errors associated with the excitation sequence. The resulting volume is then only limited by the very small chemical shift misregistration of the very selective saturation pulses.

15 Claims, 4 Drawing Sheets

MAGNETIC RESONANCE SPECTROSCOPIC IMAGING HAVING REDUCED CHEMICAL SHIFT ERROR

BACKGROUND OF THE INVENTION

This invention relates generally to magnetic resonance spectroscopy, and more particularly, the invention relates to volume spectroscopy in which chemical shift error is reduced.

Volume localized magnetic resonance spectroscopy has become a useful and routine clinical tool especially for the detection of abnormalities which lead to diffused chemical changes in brain. Several techniques are known for directly exciting spins in a volume of interest and achieving three-dimensional selection including use of stimulated echoes and the use of Carr-Purcell echoes. These techniques obtain a localized spectrum in a single scan. For example, point resolved spectroscopy (PRESS, see U.S. Pat. No. 4,480,228) uses a three pulse sequence with each pulse being frequency selective.

Many important clinical applications of proton magnetic resonance spectroscopic imaging, MRSI, are based on phase encoding of a restricted volume of excitation. Typically, the volume excitation is achieved using PRESS, which takes advantage of three orthogonal slices in the form of a double spin echo to select a specific region of interest. Unfortunately, one weakness of this approach is that the range of chemical shift frequencies (over 200 Hz for proton at 1.5T) is not insignificant relative to the limited band width of most excitation pulses (1000–2000 Hz). The result is misregistration of the volume of interest for chemical shift frequencies not at the transmitter frequency. This is illustrated in FIG. 1. The chemical shift error causes the greatest difficulty for signals excited by the transition band portion (f) of the RF profile. Except for the portion of the pass band common to the chemical shift frequencies of interest (c), each resonance will be excited differently. Thus, when a PRESS volume is resolved by MRSI, the chemical levels are not only dependent on tissue level, T1 and T2, but are also dependent on location within the volume of interest. The only exception is within the limits of the common pass band (rf pass band(a)–chemical shift error(d)). Within the transition bands the magnitude of the error is dependent on chemical shift error and shape of the transition band. One figure of merit is the difference in excitation at the extremes of the desired chemical shift over 90% of the transition band: Max_error=chemical shift bandwidth)* (slope of transition band). This assumes that the transition band is relatively linear and that slope represents the transition bandwidth over which excitation increases from 5% to 95% of the peak value. These values can exceed 40% for 90° excitations and 60% for the refocusing pulses used in PRESS.

To reduce the uncertainty of the spatially dependent changes in the measurement of tissue levels and peak ratios in focal applications of MRSI, it is important to maximize % selectivity [defined as: (pass band/(pass band+transition bands))*100] and to minimize % chemical shift error [defined as: ((chemical shift bandwidth)/(effective rf bandwidth))*100. At typical clinical scanner $B_1$ fields of ~0.2 Gauss, it is difficult to design refocusing pulses as required in PRESS, with selectivity greater than 59% and chemical shift error of less than 20% for a chemical shift range of 3.4 ppm at 1.5T.

Since the selectivity in a focal MRSI application is limited by both transition band width and chemical shift, it is convenient to define the actual selectivity as: % selectivity_mrsi=((pass band−chemical shift error)/(pass band+transition bands+chemical shift error))*100. With this definition, a typical selectivity as described above would only be 46% for a refocusing pulse and would be about 52% for a typical 90° excitation. With selectivity of less than 50%, voxels resolved outside of this selectivity must either be ignored or corrected for excitation profile. Ultimately, however, it would be preferable to improve Focal MRSI selectivity, to avoid these corrections and concomitant assumptions.

Le Roux et al., U.S. Pat. No. 5,537,039 for VIRTUAL FREQUENCY ENCODING OF ACQUIRED NMR IMAGE DATA addresses this problem in effect by distorting the phase encoded frequencies to match the slice selection misregistration. This is accomplished by adding evolution time encoding to each phase encode increment. The downside for spectroscopic imaging are the impacts of evolution time encoding on coupled spins, and the impact of exciting large signals such as lipid outside the volume of interest.

SUMMARY OF THE INVENTION

In accordance with the present invention, a volume excitation such as PRESS is combined with very selective out of volume saturation pulses to suppress signal from outside of the volume-of-interest and to minimize chemical shift error within that volume. The use of very selective saturation bands on either side of the volume of interest eliminates the PRESS excitation outside of the location/frequency band of interest and chemical shift attendant therewith. Signals are then detected from the volume-of-interest.

The invention and objects and features thereof will be more readily apparent from the following detailed description and appended claims when taken with the drawings.

DETAILED DESCRIPTION OF THE ILLUSTRATED EMBODIMENTS

Figure 1:
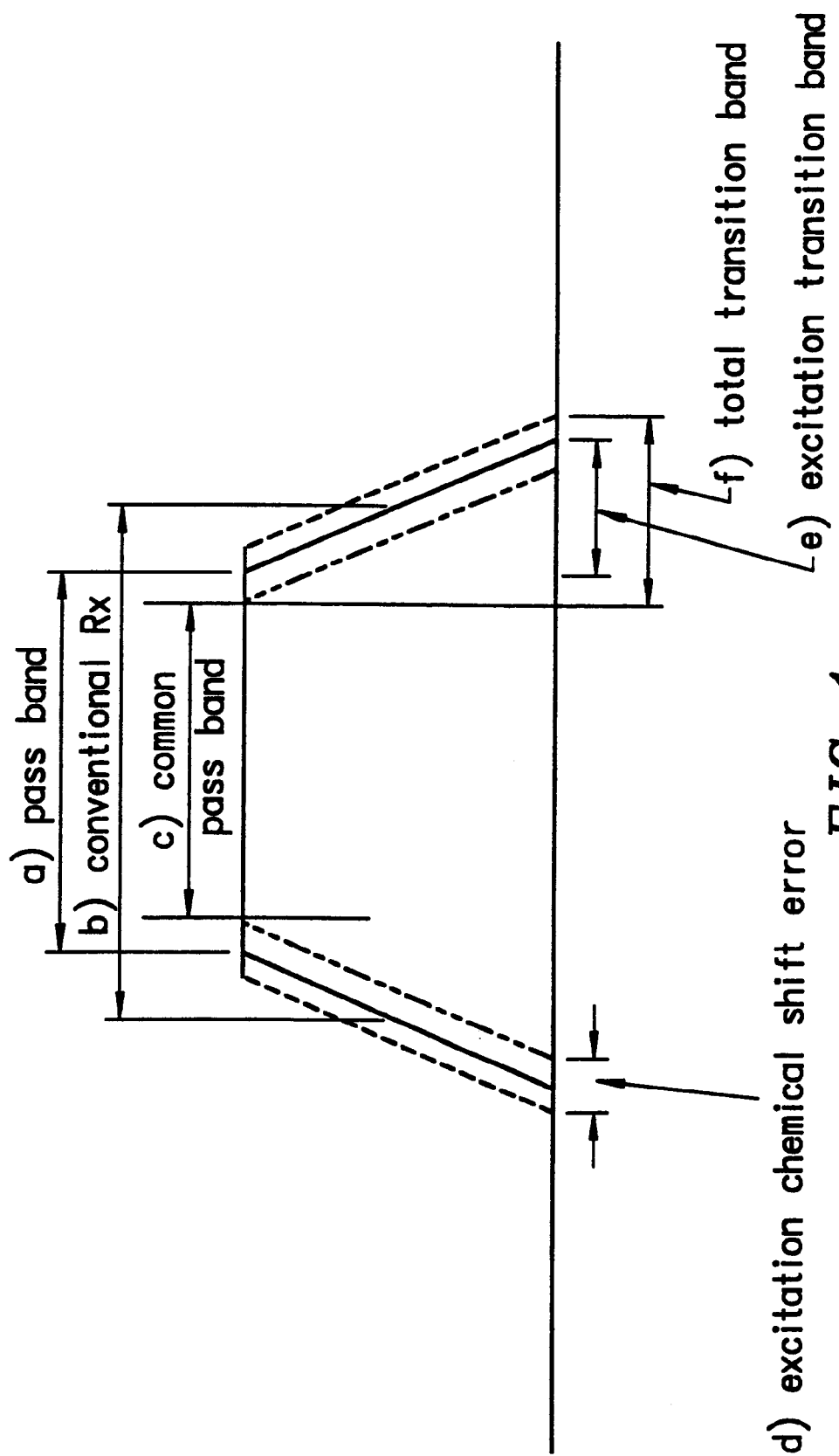
FIG. 1 illustrates error from chemical shift in a selected slice in magnetic resonance spectroscopic imaging.
Figure 2A:
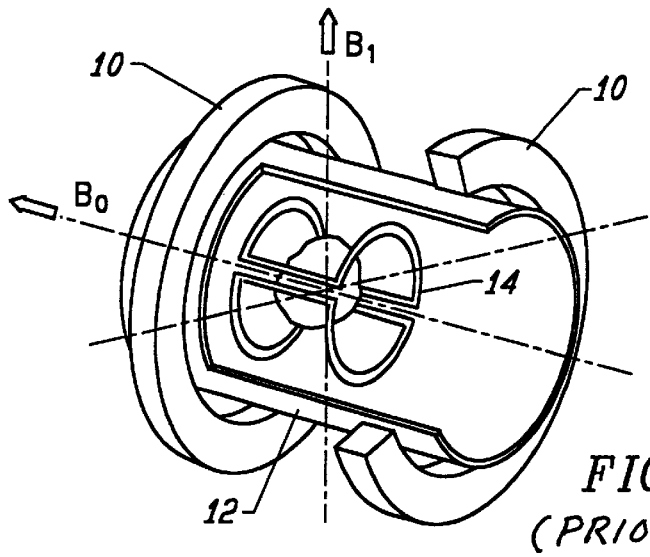
FIGS. 2A–2D illustrate the arrangement of conventional MRI apparatus and magnetic fields generated therein.
Figures 2B, 2C, 2D:
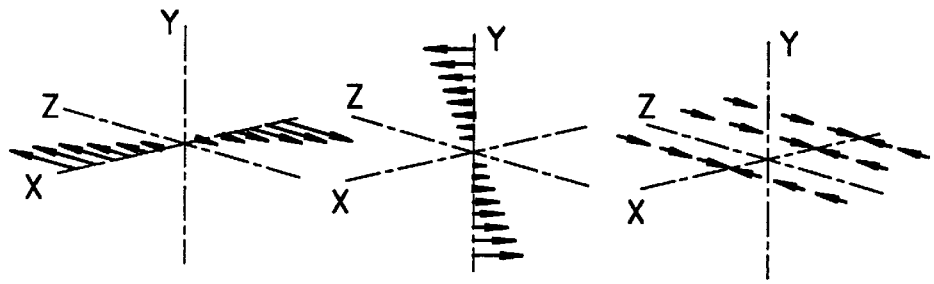

Referring now to the drawings, FIG. 2A is a perspective view partially in section illustrating conventional coil apparatus in an MRI system, and FIGS. 2B–2D illustrate field gradients which can be produced in the apparatus of FIG. 2A. This apparatus is discussed in Hinshaw and Lent, "An Introduction to NMR Imaging: From the Bloch Equation to the Imaging Equation," *Proceedings of the IEEE*, Vol. 71, No. 3, March 1993, pps. 338–350. Briefly, the uniform static field $B_0$ is generated by the magnet comprising the coil pair 10. A gradient field G(x) is generated by a complex gradient coil set which can be wound on the cylinder 12. An RF field $B_1$ is generated by an RF coil 14. A sample being studied would be positioned along the Z axis within the RF coil 14.

In FIG. 2B, an X gradient field is shown which is perpendicular to the static magnetic field $B_0$ and varies linearly with distance along the X axis but does not vary with distance along the Y or Z axes. FIGS. 2C and 2D are similar representations of the Y gradient and Z gradient fields, respectively.

Figure 3:
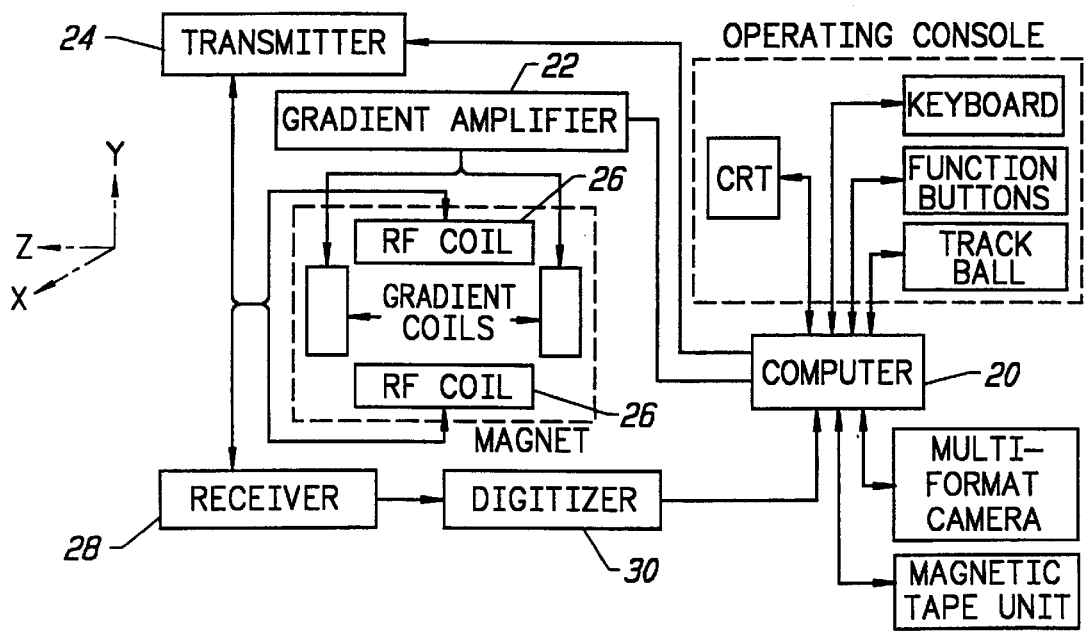
FIG. 3 is a functional block diagram of MRI and spectroscopy apparatus.

FIG. 3 is a functional block diagram of conventional NMR apparatus. A computer 20 is programmed to control the operation of the MRI apparatus and process FID signals detected therefrom. The gradient field is energized by a gradient amplifier 22, and the RF coils for generating $B_1$ field at the Larmour frequency are controlled by the transmitter 24 and the RF coil 26. After the selected nuclei have been excited, the RF coils 26 are employed to detect the FID signal which is passed to the receiver 28 and then through digitizer 30 for processing computer 20.

In accordance with the invention, a volume excitation pulse such as PRESS is combined with out of volume saturation pulses to suppress relaxation signal recovery from outside of the volume of invention. Co-pending application Ser. No. 08/683,589, filed Jul. 15, 1996 by Patrick L. LeRoux, co-applicant, for REAL TIME RF PULSE CONSTRUCTION FOR NMR MEASUREMENT SEQUENCES, discloses a method for constructing such out-of-volume saturation pulses.

As discribed in the copending application, the RF pulse for NMR pulse sequence is designed in the NMR system using an inverse SLR transformation method. The polynomials required for the SLR transformation are calculated using a weighted least mean squares ("WLMS") process in which an initial weighting function is employed along with the desired pulse profile that is input by the NMR system operator. The operator can also specify the phase profile as an input to the WLMS process. More specifically, the desired pulse profile des($\omega$) is input, a weighting function W($\omega$) is calculated, a set of SLR polynomials are calculated using a weighted least mean squares process having as inputs the desired pulse profile des($\omega$) and the weighting function W($\omega$), and the SLR polynomials are employed in an inverse SLR process to produce an RF pulse waveform R(t). The RF pulse may be produced in the MRI system in response to an RF pulse profile specified by the operator prior to a scan which uses the RF pulse.

In addition to specifying the magnitude of the excitation as a function of frequency, the RF pulse profile specification may also include a phase specification. In such case, the phase specification is also input to the weighted least means squares process and that process may be repeated one or more times to satisfy the desired magnitude specification.

In addition to very small transition band widths, these saturation pulses have very large effective rf band widths, and hence very little chemical shift error. With these saturation pulses it is possible to define a localized volume with a percent selectivity_MRSI of up to 99%. The problem with defining a volume with out-of-volume saturation only, is that once the desired volume gets much smaller than the overall excited volume selectivity drops, and even relatively modest relaxation recovery of the saturated signal can compromise the result within the volume of interest.

Figure 4:
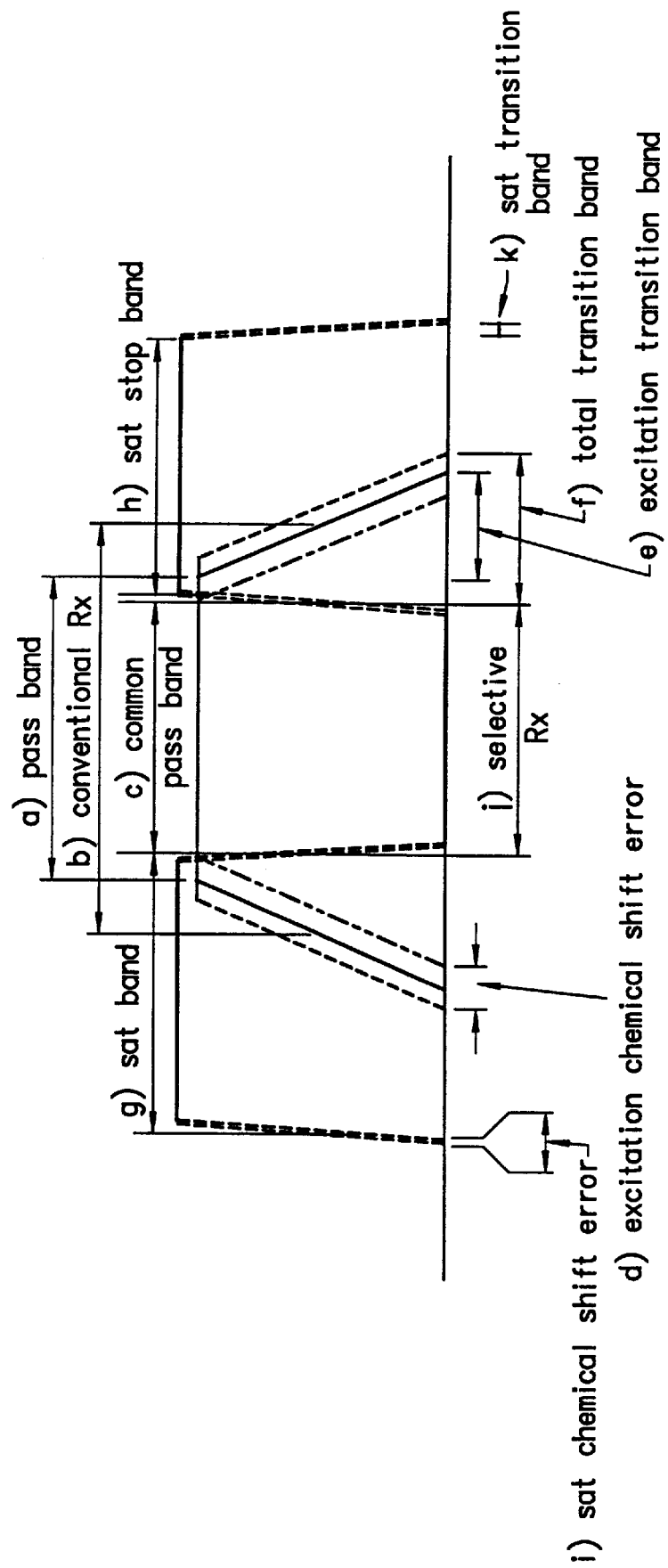
FIG. 4 illustrates volume excitation with reduced chemical shift error by using saturation pulses in accordance with the invention.
Figure 5:
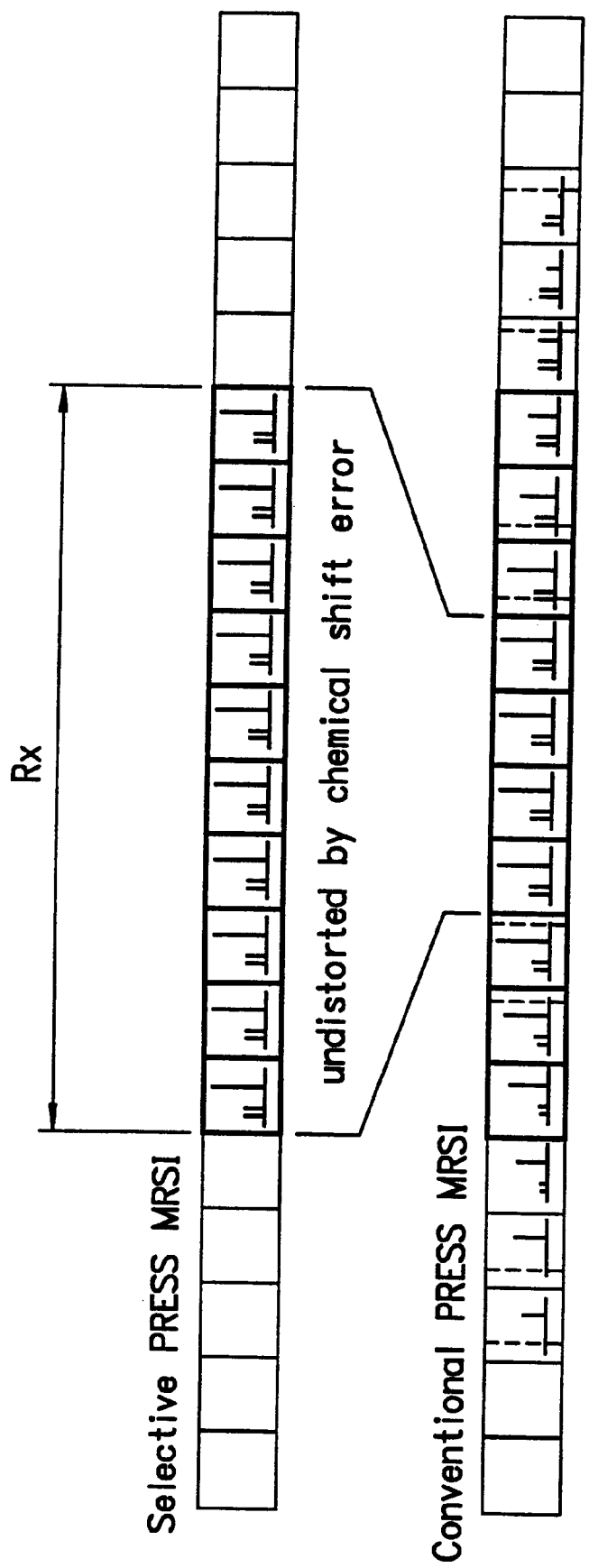
FIG. 5. illustrates improved MRSI resolution using the present invention.

The invention uses the combination of PRESS and very selective out-of-volume saturation pulses to improve selectivity and significantly reduce chemical shift errors in focal MRSI. The concept is illustrated in FIG. 4. In this method, very selective saturation bands(g) are used to eliminate the PRESS excitation volume outside the common pass band(c). The new prescription (j) restricts the volume of interest such that it is only dependent on the very selective sat bands for its % selectivity_MRSI. By restricting the work load of the sat bands to the total transition bands(f), the width of the sat bands can be constrained and problems with relaxation recovery of saturated signal is minimized. FIG. 5 illustrates the impact of 1 cm MRSI resolution of a conventional 10 cm Rx PRESS volume versus a 10 cm Rx with the very selective PRESS VOLUME.

There has been described a method of minimizing chemical shift error in magnetic resonance spectroscopic imaging by combining a volume excitation with out-of-volume saturation pulses to suppress relaxation signal recovery from outside of the volume of interest. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of magnetic resonance spectroscopic imaging with reduced chemical shift error comprising the steps of:
   a) placing an object to be imaged in a magnetic field;
   b) applying selective out of volume saturation pulses at frequencies outside of the volume of interest thereby suppressing any subsequent generation of signal from outside the volume of interest, said selective out of volume saturation pulses being formed by:
      (i) providing data des ($\omega$) which indicates a desired pulse profile;
      (ii) calculating an initial weighting function W ($\omega$);
      (iii) calculating a set of SLR polynomials using a weighted least mean squares process, the desired pulse profile des ($\omega$); and
      iv) producing the RF pulse envelope R(t) by performing an inverse SLR transformation using the calculated SLR polynomials,
   c) applying a pulse sequence to selectively excite a slice or volume larger than the volume of interest such that the volume of interest is excited by a passband common to all desired chemical shift frequencies; and
   d) detecting a signal from the chemical shift insensitive volume of interest.

2. The method defined in claim 1 wherein, the volume of interest is further resolved by one dimensional or by multidimensional phase encoding.

3. The method as defined by claim 2 wherein step c) includes Point Resolved Spectroscopy (PRESS).

4. The method defined in claim 2 wherein step c) includes Stimulated Echo Acquistion Mode (STEAM).

5. The method defined in claim 2 wherein step c) includes one dimensional slice selection.

6. The method defined in claim 2 wherein step c) includes two dimensional slice selection.

7. The method defined in claim 1, wherein, the volume of interest is further resolved by phase and frequency encoding.

8. The method as defined by claim 7 wherein step c) includes Point Resolved Spectroscopy (PRESS).

9. The method defined in claim 7 wherein step c) includes Stimulated Echo Acquistion Mode (STEAM).

10. The method defined in claim 7 wherein step c) includes one dimensional slice selection.

11. The method defined in claim 7 wherein step c) includes two dimensional slice selection.

12. The method as defined by claim 1 wherein step c) includes Point Resolved Spectroscopy (PRESS).

13. The method defined in claim 1 wherein step c) includes Stimulated Echo Acquistion Mode (STEAM).

14. The method defined in claim 1 wherein step c) includes one dimensional slice selection.

15. The method defined in claim 1 wherein step c) includes two dimensional slice selection.

* * * * *